United States Patent

Lemecha

[15] 3,661,638

[45] May 9, 1972

[54] PROCESS FOR UNIFORMLY COATING PRINTED CIRCUIT BOARD THROUGH HOLES

[72] Inventor: Bogdan Lemecha, Dearborn, Mich.

[73] Assignee: Photocircuits Corporation, Glen Cove, N.Y.

[22] Filed: May 26, 1970

[21] Appl. No.: 40,682

[52] U.S. Cl. ................................ 117/212, 117/98, 117/101, 117/102 R, 118/56, 118/57

[51] Int. Cl. .................... B44d 1/18, B05c 11/00, B05c 11/10

[58] Field of Search .................. 117/212, 102 R, 98, 101, 62; 118/56, 57

[56] References Cited

UNITED STATES PATENTS

| | | | |
|---|---|---|---|
| 3,416,958 | 12/1968 | Oxford | 117/212 |
| 3,483,616 | 12/1969 | Shompe | 117/212 X |
| 3,491,779 | 1/1970 | McLain et al. | 134/104 |
| 3,393,659 | 7/1968 | Holt, Jr. et al. | 118/56 |
| 3,200,788 | 8/1965 | Tardoskeggi | 117/101 |
| 3,359,132 | 12/1967 | Wittmann | 117/101 X |
| 3,046,157 | 7/1962 | Nyman | 118/56 X |
| 3,031,339 | 4/1962 | Regan, Jr. et al. | 118/56 X |

*Primary Examiner*—Alfred L. Leavitt
*Assistant Examiner*—Kenneth P. Glynn
*Attorney*—Morgan, Finnegan, Durham & Pine

[57] ABSTRACT

A method and apparatus for leveling and controlling the thickness of conductive material on the walls of the through holes of a printed circuit board and for removing excess conductive material therefrom the steps comprising, immersing a printed circuit board having conductive material deposited in the through holes thereof into a heated bath of a heated conductive material, heating the conductive material in the through holes until said conductive material is in a molten state and, while said conductive material is molten, gyating said circuit board in said bath in a plane substantially normal to the axis of said through holes and thereby causing said molten conductive material to flow circumferentially and axially of said through holes to form a level and uniform coating of said conductive material on the walls of said through holes and cause any excess of said conductive material to flow out of said through holes onto the surfaces of said circuit board; said apparatus including a heated bath of heat conductive material, means for supporting at least one circuit board in said bath and means for gyrating a circuit board supported in said bath in a plane substantially normal to the axis of through holes passing through said board.

7 Claims, 5 Drawing Figures

INVENTOR.
BOGDAN LEMECHA
BY
Morgan, Finnegan, Durham & Pine
ATTORNEYS

INVENTOR.
BOGDAN LEMECHA
BY
Morgan, Finnegan, Durham & Pine
ATTORNEYS

PROCESS FOR UNIFORMLY COATING PRINTED CIRCUIT BOARD THROUGH HOLES

The present invention relates to a method and apparatus for leveling and controlling the thickness of conductive material on the walls of through holes of a printed circuit board and for removing the excess amount of conductive material therefrom.

Printed circuit boards are generally fabricated from a resinous dielectric base and have conductive patterns in the form of electrical circuitry in or upon one or more of the faces thereof. The conductive patterns can be applied in any number of ways. Methods such as vapor deposition, electroplating, electroless plating and others are well known, utilized in the art and are only exemplary of methods of forming the conductive patterns on printed circuit boards to which the instant invention is applicable. It is not the intention to limit the instant invention to any particular method by which the conductive patterns are applied to a circuit board base. Rather, it is intended that the instant invention be applicable to any of the methods for forming the electrical circuitry utilized within the art which are compatible with the process and apparatus of the instant invention.

In the manufacture and use of printed circuit boards, it is customary to interconnect the printed circuit conductive patterns, where such interconnections are required, and to connect the conductive patterns to components later added to the board with through holes passing through such board. Such through holes are usually provided in the board after the conductive patterns have been printed or formed. The board may be drilled at the points where interconnections between the conductive patterns or connections for components are required. The walls of such through holes are then coated with a conductive material, usually a metal.

One method utilized for coating the walls of through holes of a printed circuit is to apply a solder mask over the faces of the circuit board where conductive materials are not to be coated and to thereafter immerse the masked board in a molten solder bath. The molten solder in such bath flows into the through holes and, when the board is withdrawn from the bath, solidifies on the walls of the through holes and forms a conductive coating therein. One of the difficulties of this method, and other methods wherein molten metal is flowed into the through holes, is that, in solidifying, the conductive metal does not form a uniform deposit on the through hole walls. Thus, the wall for its full length and full circumference may not be coated. Furthermore, the amount of metal and, hence, the thickness of the coating, may vary from through hole to through hole.

Coating of the through hole walls for less than their full length or full circumference can adversely effect the continuity of the circuit form. Variations in the thickness of such coating can adversely effect fabrication when components are added. Thus, if too little conductive metal is deposited on the through hole wall, electrical contact between the wall coating and the component lead may not be attained when the component is added and the lead is soldered. Where, on the other hand, too much conductive metal is deposited on the through hole wall, the remaining hole may be too small to accommodate the lead or, if the lead is accommodated, may provide a clearance too small to allow capillary flow of the solder during soldering.

In the instant invention, the difficulties of providing a coating of conductive material, such as metal, along the full length and for the full circumference of the through holes of a circuit board and, at the same time, to provide a coating of uniform thickness in all of the circuit board through holes, are overcome. This is accomplished, in the instant invention, by gyrating the circuit board, with the conductive coating material in the through holes, about an axis substantially normal to the surfaces of the circuit board and the through holes therein. As the board is gyrated, the conductive material in the through holes is heated until such material is molten. The gyrating board causes the molten material to flow circumferentially around the through holes and axially of the holes. Such circumferential and axial flow assures a continuous coating on the wall of each through hole in the gyrating board.

As the board is gyrated, with the conductive material in the through holes molten and flowing circumferentially and axially, excess conductive material in the through holes is forced, axially, to the ends of the through holes, i.e., to the faces of the board. Thus, such excess material flows out of the holes onto the surfaces of the board where, after gyration is stopped and the material is cooled and solidified, the excess material can be removed by brushing, washing or in any other suitable manner.

It is, of course, important in the practice of the instant invention, that, while the board is being gyrated, the temperature of the conductive material in all of the through holes in the board be at substantially the same temperature. This is important because, if the conductive material is not molten, the required circumferential and axial flow of such conductive material will not occur. To provide such uniformity of temperature in the instant invention, the board to be treated is immersed and gyrated in a heated bath of material compatible with the board and the conductive material. A bath of hot wax, heated to a temperature at which the conductive material is molten or plastic and will flow, has been found to be particularly suitable. Obviously, other heat conductive materials that will uniformly heat the board and the conductive material in the through holes might be utilized for the bath.

The apparatus that has been found to be particularly suited for carrying out the instant invention and for use in the production of circuit boards, includes a mounting frame suspended horizontally from a series of overhead flexible supports. A series of linear motion devices such as pneumatic or hydraulic cylinders, voice coil type drivers, or similar units, are attached to the mounting frame and interconnected such that, upon the activating of the devices, a planar, orbital force is applied at the points where the linear motion devices are attached to the mounting frame. The circuit board to be treated is mounted within the mounting frame. Means are provided for dipping the frame and the printed circuit board mounted therein into a heated bath and for withdrawing the frame and mounted circuit board from the bath.

The linear motion devices are connected to a series of power oscillators phased so that, when connected to the linear motion devices, forces are applied to the frame and mounted circuit board in a repetitive, planar, sequential series. The result is an effective means for gyrating a circuit board so as to apply to the walls of the through holes of the circuit board a uniform rotating force which removes excess amounts of conductive material from the through holes.

It will be understood that the foregoing general description and the following detailed description as well are exemplary and explanatory of the invention but are not restrictive thereof. Thus, while the orbital leveling device of this invention is particularly adapted to and was primarily designed for use in removing excess conductive material from printed circuit boards, the principles underlying the objects of the invention are not limited to such usage. However, since the invention is particularly adaptable to such useage, reference will be made hereinafter thereto in order to provide an example of a practical and useful embodiment of the invention.

The accompanying drawings, referred to herein and constituting a part thereof, illustrate the preferred embodiments of the invention, and together with the description, serve to explain the principles of the invention.

Figure 1:
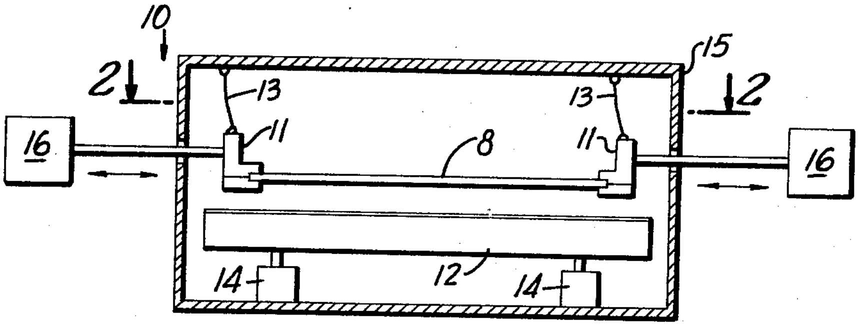
FIG. 1 is a view in front elevation of the orbital leveling apparatus.
Figure 2:
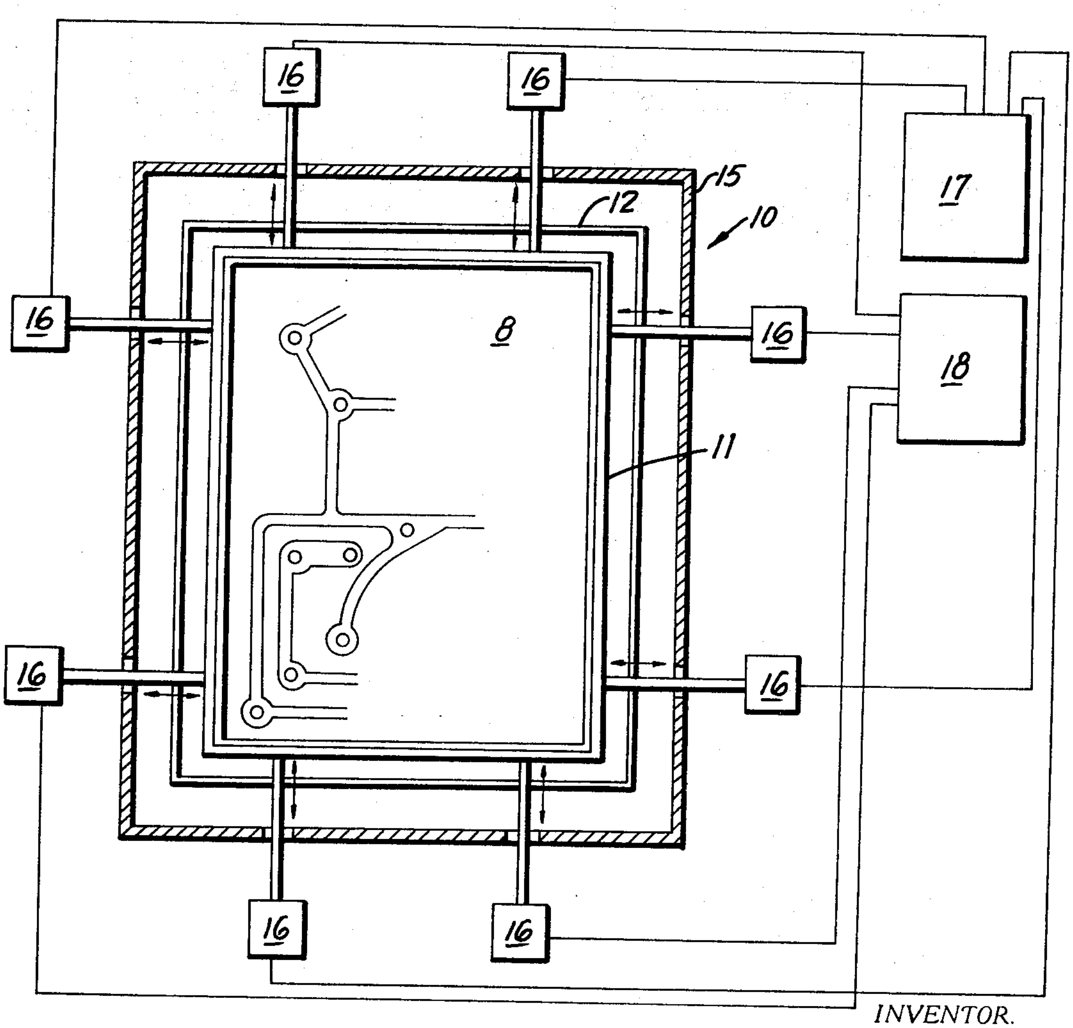
FIG. 2 is a sectional view of the orbital leveling apparatus taken along line 2 — 2 of FIG. 1.

Referring now more particularly to the embodiment of the invention shown in the accompanying drawings, there is illustrated in FIG. 1 an orbital leveling apparatus, indicated generally be reference numeral 10.

A mounting frame member 11, capable of supporting a printed circuit 8 about the board's perimeter, is horizontally suspended over a hot bath container 12 by flexible suspension members 13.

In accordance with the invention, hot bath container 12 rests upon jack members 14 thus enabling the selective raising and lowering of hot bath container 12 with respect to mounting frame 11. In this manner, a means is provided by which mounting frame member 11 can be dipped into hot bath container 12. As here preferably embodied, hot bath container 12 is filled with wax whose temperature is raised to approximately 500° F.

A housing 15 encloses that portion of the orbital leveling apparatus that may prove to be hazardous due to the spattering of hot wax or heated, excess metal. Housing 15 can be fabricated from any material that can withstand temperatures in excess of the hot bath temperature.

In accordance with the invention, a series of linear motion devices 16; namely, voice coil type drivers are utilized. Pneumatic or hydraulic cylinders as well as any other type of linear motion device are also within the scope of the invention; and thus voice coil type drivers as referred to above should be viewed as merely exemplary in nature and should not be interpreted as a restriction upon the scope of the invention.

Figure 3:
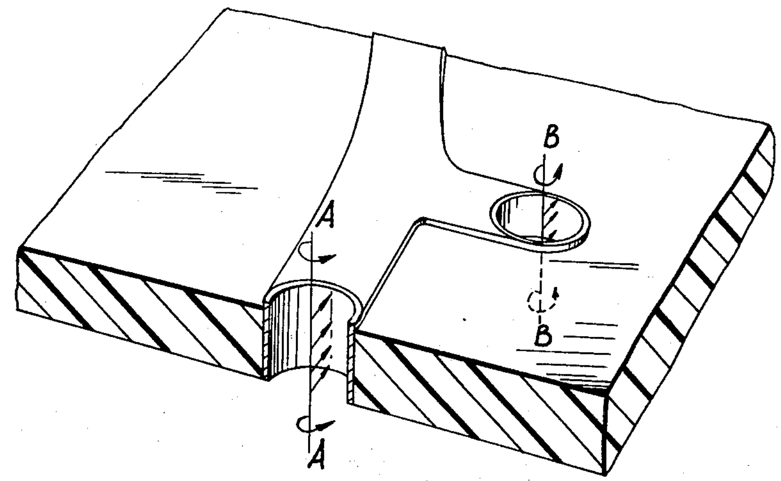
FIG. 3 is an enlarged perspective view of a portion of a printed circuit board illustrating the forces applied to the walls of the printed circuit board through holes when the board is gyrated in accordance with the invention.
Figure 4:
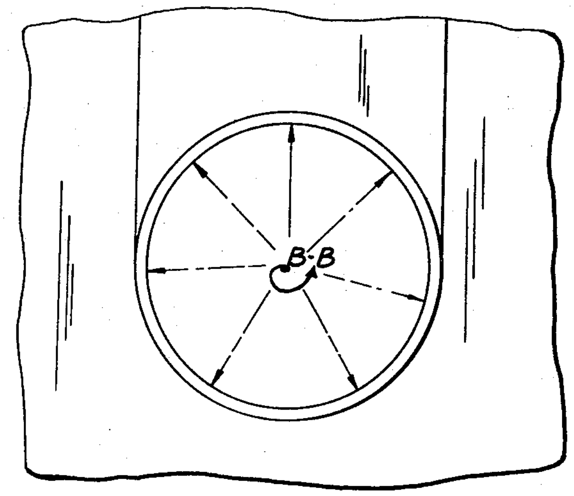
FIG. 4 is an enlarged partial top view of FIG. 3 taken parallel to axis B—B and illustrating the resulting rotational force pattern applied to the wall of a printed circuit board through hole when the printed circuit board is gyrated in accordance with the invention.
Figure 5:
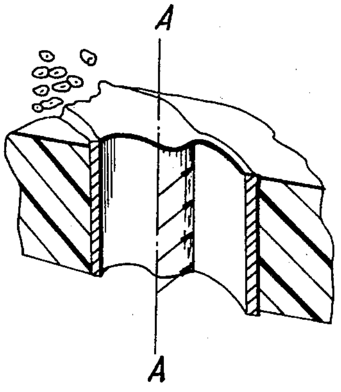
FIG. 5 is an enlarged perspective view taken along axis A-A of the through hole illustrated in FIG. 3 wherein is illustrated the manner by which excess conductive material is removed from the through hole in accordance with the invention.

A pair of power oscillators 17 and 18 are utilized for supplying sequentially selected pulses to drivers 16. By having the power oscillators operate 90° out of phase with respect to each other, reptetive horizontal forces are imparted to the walls of the through holes appearing within the printed circuit board (FIGS. 3–5), the forces rotating about the perimeter of each hole (FIG. 4) at a speed dependent upon the frequency of the oscillators. By selectively coordinating the number of linear motion devices with the frequency of the oscillators and with the planar force applied by the linear motion devices, variations as to the thickness of the conductive coating applied to the walls of the through holes of a printed circuit board can be achieved. As here preferably embodied, eight voice coil type drivers are positioned symmetrically about mounting frame 11.

To remove excess amounts of conductive material from a printed circuit board 8, said board is mounted upon mounting frame 11 and then dipped into a hot wax bath, whose temperature is sufficient to raise the temperature of the conductive material to its plastic or liquid state. It should be noted that more than one circuit board can be mounted and gyrated at a particular time. With circuit board 8 in the hot wax bath, drivers 16 are sequentially pulsed by power oscillators 17 and 18, the pulses being phased with respect to each other so as to pulse drivers 16 in rotational sequence. The result of such pulsing is the application to the walls of the through holes of a planar force that rotates about the walls of the through holes (FIG. 4) causing the plastic or liquid conductive material that has been heated, to flow circumferentially out of the hole (FIG. 5) and leave each through hole with a uniformly thick conductive coating whose thickness is selectively controllable depending upon the bath temperature, the number of drivers utilized, the planar force applied to the printed circuit board by the drivers and the frequency of power oscillators 17 and 18. The excess conductive material that has been forced from the walls of the through holes will "ball-up", due to surface tension of the material. Some of such balled-up material may fall from the surface of the printed circuit board because of the gyrating motion of the board. Any material remaining can be easily brushed off, washed off or removed in any other suitable manner.

In the practice of the instant invention, it is preferred to first dip the board into the hot wax bath before drivers 16 are actuated and, with the board in the hot wax bath, then actuate the drivers. Thus, the board is in the hot wax bath when pulsing of drivers 16 and consequential gyration of the board commences. This gyration of the board is continued until after the board is withdrawn from the bath and the conductive coating has cooled and hardened. Continuing the pulsing and gyration while the board is being withdrawn from the hot wax bath and until the conductive coating has cooled and hardened is important to assure that the conductive material remains flattened and uniformly coated on the through hole walls and does not flow downwardly in the through hole. Gyration of the board need only continue, after the board is withdrawn from the hot wax bath, until the conductive material coating the through holes has solidified.

The preceding description and accompanying drawings relate primarily to the use of the orbital leveling machine for the removal of excessive conductive material from the through holes of a printed circuit board. However, as previously mentioned, it will be understood that the orbital leveling apparatus of the invention is not, in its broader aspects, limited to the specific embodiment herein shown and described but departures may be made therefrom within the scope of the accompanying claims, without departing from the principles of the invention and without sacrificing its chief advantages.

What is claimed is

1. A process for uniformly coating through holes of a printed circuit board with a conductive material and for removing the excess of said conductive material from such through holes, comprising the steps of:

a. horizontally mounting a printed circuit board having a conductive material in the through holes;

b. heating said conductive material to at least its plastic state;

c. while said conductive material is in said plastic state, gyrating said board and each of said through holes in orbital paths about axes substantially parallel to the axis of said through holes and causing said plastic conductive material to gyrate circumferentially around and flow axially through said through holes; and d. while continuing said gyration, cooling and solidifying said conductive material.

2. The process as described in claim 1 wherein said heating is accomplished by dipping said circuit board into a hot wax bath.

3. A process as recited in claim 1 in which said board is gyrated through a substantially circular orbit.

4. A process as recited in claim 1 in which said board is gyrated through a substantially elipitcal orbit.

5. A process for uniformly coating through holes of a printed circuit board with conductive material and for removing the excess of said conductive material from said through holes, comprising the steps of:

a. horizontally mounting a printed circuit board having a conductive material in the through holes upon a flexibly suspended frame;

b. dipping said frame and circuit board into a heated bath and heating said conductive material to at least its plastic state;

c. while said frame and circuit board are in said heated bath and said conductive material is heated to its plastic state, applying at selected locations about said frame a series of repetitive horizontal forces in an application sequence that imparts to said printed circuit board an orbital motion about a vertical axis and a gyrating motion to said plastic conductive material in said through holes;

d. continuing said orbital and gyrating motion in said heated bath until said plastic material is distributed uniformly, circumferentially and axially of said through holes and the excess of said conductive material is removed therefrom; and e. while continuing said orbital and gyrating motion, removing said frame and circuit board from said bath and solidifying said conductive material.

6. A process as recited in claim 5 in which said repetitive horizontal forces applied to said printed circuit board are substantially equal and said orbital motion is substantially circular.

7. A process as recited in claim 5 in which said repetitive horizontal forces applied to said printed circuit board are unequal forces and said orbital motion is substantially eliptical.

* * * * *